(12) United States Patent
Byers et al.

(10) Patent No.: US 6,771,846 B2
(45) Date of Patent: Aug. 3, 2004

(54) OPTICAL INTERCONNECT FOR MEZZANINE CIRCUIT BOARDS

(75) Inventors: Charles Calvin Byers, Aurora, IL (US); Stephen Joseph Hinterlong, Elburn, IL (US); Robert Allen Novotny, Naperville, IL (US)

(73) Assignee: Lucent Technologies Inc., Murray Hill, NJ (US)

( * ) Notice: Subject to any disclaimer, the term of this patent is extended or adjusted under 35 U.S.C. 154(b) by 22 days.

(21) Appl. No.: 09/836,029

(22) Filed: Apr. 17, 2001

(65) Prior Publication Data

US 2002/0150339 A1 Oct. 17, 2002

(51) Int. Cl.[7] .............................. G02B 6/12; G02B 6/36
(52) U.S. Cl. .............................. 385/14; 385/39; 385/53
(58) Field of Search .............................. 385/14, 31, 39, 385/49, 53, 88, 92; 439/65, 66, 74

(56) References Cited

U.S. PATENT DOCUMENTS

| | | | | | |
|---|---|---|---|---|---|
| 4,133,592 | A | * | 1/1979 | Cobaugh et al. | 439/74 |
| 5,200,631 | A | * | 4/1993 | Austin et al. | 257/570 |
| 5,357,122 | A | * | 10/1994 | Okubora et al. | 257/84 |
| 5,500,540 | A | * | 3/1996 | Jewell et al. | 257/82 |
| 5,770,851 | A | * | 6/1998 | Park et al. | 250/208.1 |
| 5,864,642 | A | * | 1/1999 | Chun et al. | 385/14 |
| 6,343,171 | B1 | * | 1/2002 | Yoshimura et al. | 385/50 |
| 6,393,184 | B1 | * | 5/2002 | Day et al. | 385/49 |
| 6,421,474 | B2 | * | 7/2002 | Jewell et al. | 385/14 |
| 6,453,083 | B1 | * | 9/2002 | Husain et al. | 385/17 |
| 6,477,286 | B1 | * | 11/2002 | Ouchi | 385/14 |
| 6,485,192 | B1 | * | 11/2002 | Plotts et al. | 385/75 |
| 2002/0105699 | A1 | * | 8/2002 | Miracky et al. | 359/159 |
| 2002/0118907 | A1 | * | 8/2002 | Sugama et al. | 385/14 |

* cited by examiner

Primary Examiner—Edward J. Glick
Assistant Examiner—Thomas R Artman

(57) ABSTRACT

An optical interface is provided to supplement an electrical interface between a main circuit board (102) and a mezzanine circuit board (104) that is mounted above the main circuit board. The mezzanine circuit board is mounted generally parallel to, and above the main circuit board. In between the two circuit boards is provided an optical interface. A light source (200) is mounted to one of the circuit boards and a complementary photo detector (202) is mounted on the other circuit board in a manner such that the photo detector receives light from the light source. Two optical interfaces are preferred for two-way communication between the main circuit board and the mezzanine circuit board. The light source is preferably a laser and the photo detector is preferably a photo diode. The optical interface provides a high speed interconnect to increase conductivity and functionality between the main circuit board and the mezzanine circuit board.

23 Claims, 2 Drawing Sheets

OPTICAL INTERCONNECT FOR MEZZANINE CIRCUIT BOARDS

FIELD OF THE INVENTION

The invention generally relates to circuit board interconnections, and in particular, to an optical interconnect for connecting mezzanine circuit boards to a base or main circuit board.

BACKGROUND OF THE INVENTION

High-density electronic systems, such as telecommunications systems and computers, generally use a physical design for circuit boards that permits a base board to have connectors that permit the attachment of a supplemental board to add features. For example, PCI is a standard that permits the addition of PCI mezzanine cards to a base board. A standard connector and bus are used to interconnect the functions on the PCI mezzanine card with the base board. This arrangement is particularly useful for adding I/O interfaces, such as network interfaces. Advantageously, boards are customized and new features added without a redesign of the base board.

One problem with the base board/supplemental board arrangement is that the connector and standard bus interface lack the bandwidth, performance and reliability needed to support some advanced services. This severely limits the use of the supplemental boards.

Therefore, a need exists for an additional interface to enhance the uses of a base board/supplemental board arrangement.

SUMMARY OF THE INVENTION

In summary, an apparatus is provided with a supplemental high-speed optical interface. The apparatus includes a first circuit board that is spaced adjacent a second circuit board. A light source that transmits an optical signal is coupled to the first circuit board. A photo detector is coupled to the second circuit board. The photo detector is adapted to receive an optical signal from the light source. More specifically, the first circuit board is arranged with respect to the second circuit board such that the photo detector receives the optical signal over an optical transport medium. Preferably, the light source is a laser and the photo detector is a photo diode. The optical transport medium is alternatively, free space or a light pipe. Preferably, another light source is also coupled to the second circuit board and a complementary photo detector is coupled to the first circuit board for two-way communications. A method is provided for operably arranging the circuit boards for communication.

DESCRIPTION OF THE PREFERRED EMBODIMENTS

Figure 1:
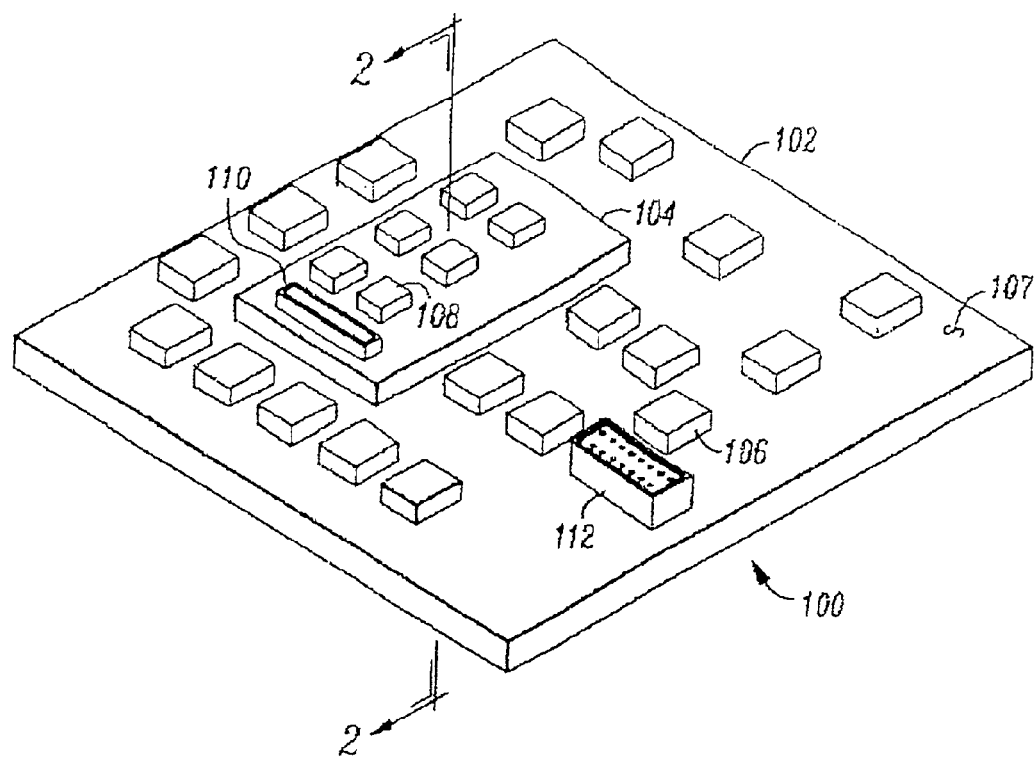
FIG. 1 is a perspective view of a circuit board arrangement in accordance with the present invention.

FIG. 1 is a perspective view of a circuit board arrangement 100 in accordance with the present invention. The circuit board arrangement 100 includes a main circuit board 102 and a mezzanine circuit board 104. The main circuit board 102 has a generally planar configuration with components 106 mounted on a surface 107 of circuit board 102. Components 106 include integrated circuits, discrete components and the like. Also mounted on circuit board 102 are connectors, such as connector 112. Connector 112 is provided for receiving a mating connector on a mezzanine circuit board.

A mezzanine circuit board 104 is shown spaced above and generally parallel to main circuit board 102. Mezzanine circuit board 104 is generally planar. Mezzanine circuit board 104 includes components 108 mounted thereon. Mezzanine circuit board 104 also includes a connector 110 that is adapted to mate with and provide electrical conductivity with a connector on main circuit board 102, similar to connector 112. The connectors 110 and 112 preferably, releasably mount mezzanine circuit board 104 above main circuit board 102.

In the typical arrangement, main circuit board 102 is substantially larger than mezzanine circuit board 104. Preferably, main circuit board 102 includes the majority of the components for implementing a function associated with circuit board arrangement 100. For example, for a processor-based interface, main circuit board 102 preferably includes the processor, memory and main peripherals. Mezzanine circuit board 104 preferably includes I/O interfaces that provide options for main circuit board 102. One example option is an Ethernet card.

Figure 2:
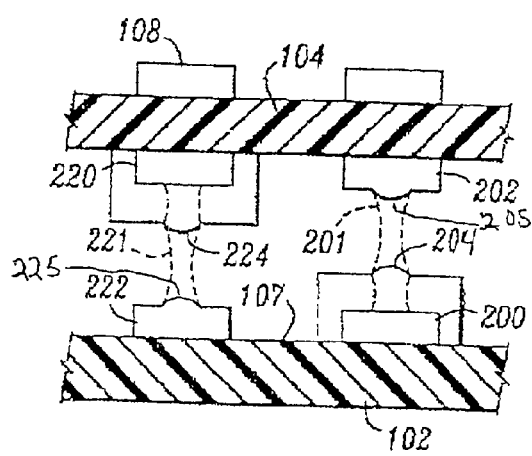
FIG. 2 is sectional view of the circuit board arrangement shown in FIG. 1.

In accordance with the present invention, in addition to the electrical conductivity provided by connectors 110,112, a supplemental optical interface is added for providing conductivity between main circuit board 102 and mezzanine circuit board 104. FIG. 2 is a sectional view of circuit board arrangement 100 illustrating a preferred supplemental optical interface in accordance with the present invention.

Main circuit board 102 has a light source 200 mounted on surface 107 in an area under mezzanine circuit board 104. Light source 200 provides an optical beam 201 for transmitting information. Mounted around light source 200 is a lens 204. Lens 204 focuses and collimates the light from light source 200. Mounted on mezzanine circuit board 104 above light source 200 and lens 204 is a photo detector 202. Photo detector 202 is mounted in a manner to receive the light from light source 200. Photo detector 202 receives the light from light source 200 such that the information modulated in the light from light source 200 is made available on mezzanine circuit board 104 as electrical signals.

For the provision of two-way communications, mezzanine circuit board 104 has a light source 220 mounted thereon. A lens 224 is provided over light source 220 to focus the light from light source 220. A photo detector 222 is mounted on main circuit board 102 to receive the light 221 from the light source 220 that is mounted on mezzanine circuit board 104. Light source 220 on mezzanine circuit board 104 provides an optical interface for the transmission of information to main circuit board 102 from mezzanine circuit board 104. In the preferred arrangement shown in FIG. 2, circuit board 102 and mezzanine circuit board 104 are mounted such that there is preferably, approximately ½ to ¼ inches between them. Preferably, lens 204 is spaced from photo detector 202 such that the distance between them is approximately the focal length of the lens 204. Similarly, lens 224 is spaced from photo detector 222 such that the distance between them is approximately the focal length of the lens 224.

In a preferred arrangement, light sources 200, 220 are lasers. Most preferably, light sources 200, 220 comprise vertical cavity surface emitting lasers. An alternative light source is a light emitting diode.

Lenses 204, 224 are any suitable lenses that focus a light from a light source. Preferably lenses 204, 224 are convex lenses formed or mounted in a lens housing that mounts over a light source to provide a difference in the index of refraction to focus a light from the light source for receipt by a complementary photo detector.

Photo detectors 202, 222 are any photo detectors suitable for detecting a light from a light source. Preferably, photo detectors 202, 222 are high data rate photo diodes comprising silicon. Most preferably, photo detectors 202, 222 include convex lenses 205, 225, respectively, that focus the light from the light sources onto the associated photo diodes. Photo detectors 202, 222 preferably generate an electrical signal corresponding to the optical signal received from a light source.

Figure 3:
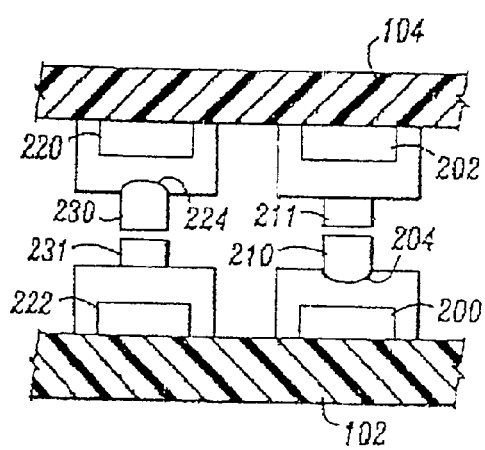
FIG. 3 is a sectional view of an alternate preferred embodiment of a circuit board arrangement in accordance with the present invention.

FIG. 3 is an alternate preferred arrangement of an optical interface in accordance with the present invention. In particular, the optical interface shown in FIG. 3 includes light pipe arrangements for assisting in the transmission of light from the light source to a photo detector. More specifically, for the transmission of light from main circuit board 102 to mezzanine circuit board 104, a light pipe 210 is coupled to lens 204. Light pipe 210 is generally cylindrical and has a height that extends outwardly from lens 204 towards mezzanine circuit board 104. A complementary light pipe 211 is mounted on and about photo detector 202. Light pipes 210, 211 preferably have an index of refraction that focuses light from light source 200 towards photo detector 202.

For the transmission of light from mezzanine circuit board 104 to main circuit board 102, a light pipe 230 is provided about light source 220 and lens 224. A complementary light pipe 231 is provided about photo detector 222. Light pipes 210, 211, 230, 231 provide an optical transport medium between a light source and a photo detector. Light pipes 210, 211, 230, 231 are preferably made of plastic and are transparent. Light pipes 210, 211, 230, 231 are alternatively molded or cast.

Figure 4:
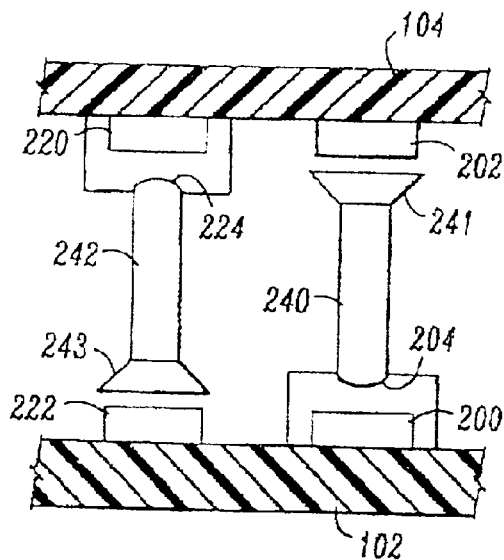
FIG. 4 is a sectional view of another alternate preferred embodiment of a circuit board arrangement in accordance with the present invention.

FIG. 4 is an alternate preferred arrangement of an optical interface in accordance with the present invention. In particular, the optical interface shown in FIG. 4 includes light pipe arrangements for assisting in the transmission of light from the light source to a photo detector, where a single light pipe is associated with the light source. More specifically, for the transmission of light from main circuit board 102 to mezzanine circuit board 104, a light pipe 240 is coupled to lens 204. No light pipe is provided on the complementary photo detector 202 mounted on mezzanine circuit board 104. A ferrule 241 is provided on an end of light pipe 240 for guiding light pipe 240 about photo detector 202. For the transmission of light from mezzanine circuit board 104 to main circuit board 102, a light pipe 242 is provided about light source 220. No light pipe is provided on the complementary photo detector 222 mounted on main circuit board 102. A ferrule 243 is provided on an end of light pipe 242 for guiding light pipe 242 about photo detector 222. Light pipes 240, 242 provide an optical transport medium from a light source to a photo detector. Light pipes 240, 242 are preferably made of plastic and are transparent. Light pipes 240, 242 are alternatively molded or cast. Ferrules 241, 243 are preferably integral to the light pipe and made of molded or cast plastic.

Figure 5:
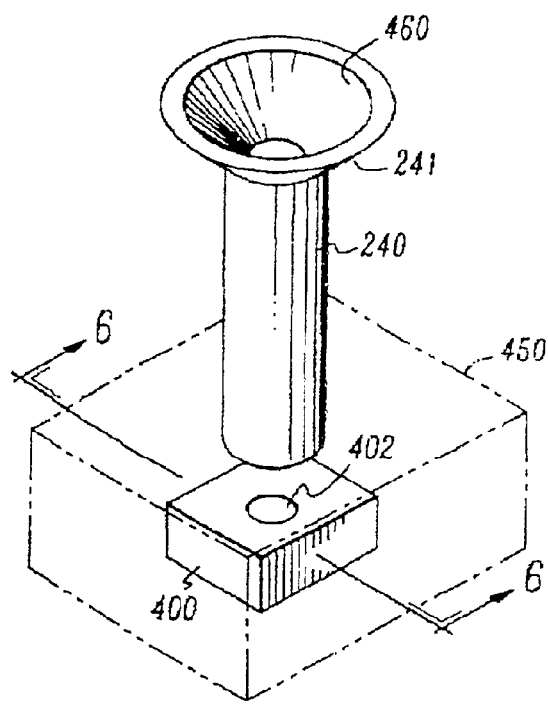
FIG. 5 is a perspective view of an optical interface in accordance with the present invention.
Figure 6:
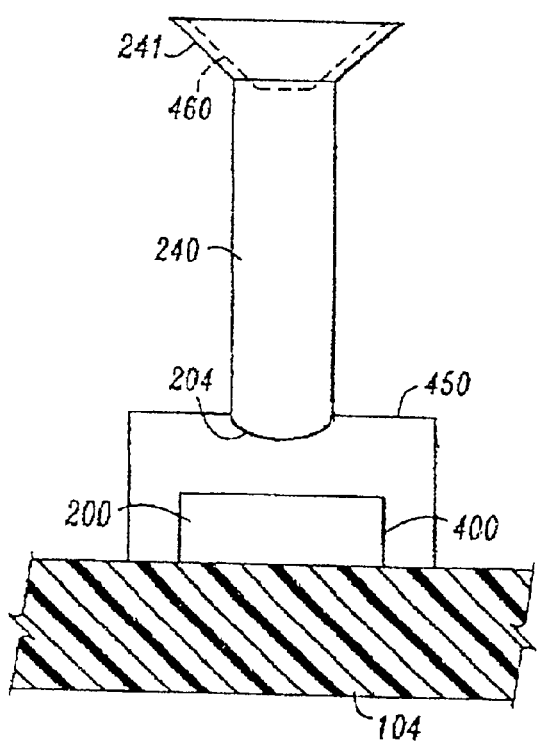
FIG. 6 is a sectional view of the optical interface shown in FIG. 5.

FIG. 5 is a perspective view showing in detail an optical interface as shown in FIG. 4. In particular, FIG. 5 shows the optical arrangement including light pipe 240 and ferrule 241. FIG. 6 is a sectional view of the optical interface shown in FIG. 5. As best seen in FIG. 5, light source 200 includes a housing or package 400. Package 400 has a window 402, which provides an opening through package 400. Mounted within package 400 is a laser or other light source. Lens 204 is formed in a lens housing 450 that is rectangular in configuration to mount over package 400. Alternatively, lens 204 is integral with light pipe 240 and housing 450 serves as a ferrule for guiding light pipe 240. Lens 204 receives a light from light source 200 through window 402. Cylindrical light pipe 240 guides a light from light source 200 out towards ferrule 241. Preferably, a physical well 460 is affixed in ferrule 241 to align to photo detector housing 202. Physical well 460 preferably is an integral part formed on the end of the light pipe.

In embodiments of the invention that include a light pipe, as an alternative to mounting a lens associated with a light source in a lens housing, the lens is formed integrally with the light pipe at an end of the light pipe that is attached near the light source. The lens is preferably convex. Also, in embodiments where a single light pipe is used to interface a light source with a photo detector, the single light pipe is alternatively mounted to, or about, the photo detector or the light source.

In operation, electrical signals generated on main circuit board 102 or mezzanine circuit board 104 are converted to optical signals using light sources 200, 220. The optical signals are transmitted through lenses 204, 224, which focus the signals for perception by photo detectors 202, 222. The light from the light sources 200, 220 travels over an optical transport medium, which is preferably free space or a light pipe, such as light pipes 210, 211, 230, 231, 240, 242. Photo detectors 202, 222 receive the optical signals from light sources 200, 220 and convert the optical signals into corresponding electrical signals that are received on main circuit board 102 or mezzanine circuit board 104.

As discussed above, an optical interface is provided to supplement an electrical interface between a main circuit board and a mezzanine circuit board that is mounted on the main circuit board. The optical interface provides a high speed transport media for coupling circuits on the mezzanine circuit board with the main circuit board. The high-speed interface advantageously increases the connectivity and functionality between a main circuit board and a mezzanine circuit board.

Whereas the present invention has been described with respect to specific embodiments thereof, it will be understood that various changes and modifications will be suggested to one skilled in the art and it is intended that the invention encompass such changes and modifications as fall within the scope of the appended claim.

What is claimed is:

1. An apparatus for optical interconnection comprising:
   a first circuit board including a first connector;
   a second circuit board including a second connector, wherein the first connector is adapted to mate with the second connector to provide an electrical connection therebetween, and wherein the first connector and the second connector hold the second circuit board generally parallel to the first circuit board, where the first and second circuit boards are arranged with respect to each other such that the first circuit board is oriented above the second circuit board;

a light source coupled to the first circuit board, the light source being adapted to transmit an optical signal;

a photo detector coupled to the second circuit board, wherein when the first connector is mated with the second connector, the light source is mounted above the photo detector such that the optical signal is transmitted generally perpendicular to the first circuit board in a direction towards the photo detector, wherein the photo detector receives the optical signal over an optical transport medium.

2. The apparatus of claim 1 wherein the optical transport medium is free space.

3. The apparatus of claim 1 wherein the optical transport medium is a light pipe.

4. The apparatus of claim 3 wherein a ferrule is connected to the light pipe to guide a light from the light source.

5. The apparatus of claim 4 wherein the light pipe comprises a transparent cylinder made of plastic.

6. The apparatus of claim 4 wherein the ferrule includes a physical well.

7. The apparatus of claim 3 wherein the light pipe includes a lens that focuses light from the light source.

8. The apparatus of claim 1 wherein the light source comprises one of a laser and a light emitting diode.

9. The apparatus of claim 8, wherein the laser is a vertical cavity surface emitting laser.

10. The apparatus of claim 8 wherein the light source comprises a lens that focuses a light from the light source.

11. The apparatus of claim 1 wherein the photo detector is a photo diode.

12. The apparatus of claim 1 further comprising:

another light source coupled to the second circuit board, the another light source being adapted to transmit another optical signal;

another photo detector coupled to the first circuit board, wherein the second circuit board and the first circuit board are arranged with respect to each other such that the another photo detector receives the another optical signal over another optical transport medium.

13. The apparatus of claim 1 wherein the photo detector comprises a lens that focuses a light from the light source.

14. A method for interconnecting a first circuit board with a second circuit board, the method comprising:

affixing the first circuit board adjacent to, above, and parallel to, the second circuit board by mating a first connector mounted on the first circuit board with a second connector mounted on the second circuit board, wherein the first connector and the second connector provide an electrical connection between the first circuit board and the second circuit board;

transmitting over an optical transport medium an optical signal from a light source on the first circuit board to a photo detector on the second circuit board, wherein when the first connector is mated with the second connector, the light source is mounted above the photo detector such that the optical signal is transmitted generally perpendicular to the first circuit board in a direction towards the photo detector.

15. The method of claim 14 further comprising the step of transmitting over an optical transport medium an optical signal from a light source on the second circuit board to a photo detector on the first circuit board.

16. The method of claim 14 wherein the optical transport medium is free space.

17. The method of claim 14 wherein the optical transport medium is a light pipe.

18. The method of claim 17 wherein a ferrule is connected to the light pipe to guide a light from the light source.

19. The method of claim 18 wherein the light pipe comprises a transparent cylinder made of plastic.

20. The method of claim 14 the light source comprises one of a laser and a light emitting diode.

21. The method of claim 20 wherein the laser is a vertical cavity surface emitting laser.

22. The method of claim 18 wherein the light source comprises a lens that focuses a light from the light source.

23. The method of claim 14 wherein the photo detector is a photo diode.

* * * * *